United States Patent [19]
Suh et al.

[11] Patent Number: 5,686,825
[45] Date of Patent: Nov. 11, 1997

[54] REFERENCE VOLTAGE GENERATION CIRCUIT HAVING COMPENSATION FUNCTION FOR VARIATIONS OF TEMPERATURE AND SUPPLY VOLTAGE

[75] Inventors: Jeung Won Suh; Chang Ho Jung, both of Kyoungki-do, Rep. of Korea

[73] Assignee: Hyundai Electronics Industries Co., Ltd., Kyoungki-do, Rep. of Korea

[21] Appl. No.: 550,356

[22] Filed: Oct. 30, 1995

[30] Foreign Application Priority Data

Nov. 2, 1994 [KR] Rep. of Korea ............... 94-28644

[51] Int. Cl.⁶ ........................................... G05F 3/16
[52] U.S. Cl. .................. 323/316; 323/901; 323/907; 327/512
[58] Field of Search ................... 323/316, 901, 323/907; 327/539, 512

[56] References Cited

U.S. PATENT DOCUMENTS

| | | | |
|---|---|---|---|
| 4,368,420 | 1/1983 | Kuo | 323/907 |
| 4,628,248 | 12/1986 | Birrittella et al. | 323/314 |
| 5,132,556 | 7/1992 | Cheng | 323/316 |
| 5,493,234 | 2/1996 | Oh | 326/33 |

Primary Examiner—Peter S. Wong
Assistant Examiner—Shawn Riley
Attorney, Agent, or Firm—Gary M. Nath; Nath & Associates

[57] ABSTRACT

A reference voltage generation circuit for a semiconductor memory device comprising a reference voltage generator for generating first and second reference voltages, the first and second reference voltages having the opposite response characteristics with respect to a variation in a temperature or a supply voltage, a start-up circuit for determining an initial condition of the reference voltage generator in response to the supply voltage to stabilize the operation of the reference voltage generator, and a voltage amplifier for compensating a target reference voltage for the temperature variation in response to the first and second reference voltages from the reference voltage generator so that the target reference voltage can always be constant in level. The first reference voltage has a positive response characteristic with respect to the temperature and the supply voltage and the second reference voltage has a negative response characteristic with respect to the temperature and the supply voltage.

7 Claims, 9 Drawing Sheets

| Temperature (°C) | Reference Voltage (Vref) | |
|---|---|---|
| | Reference Voltage Generator of Prior Art | Reference Voltage Generator According to The Present Invention |
| 0 | 1.347 V | 1.402 V |
| 15 | 1.375 V | 1.399 V |
| 25 | 1.393 V | 1.397 V |
| 35 | 1.412 V | 1.395 V |
| 45 | 1.430 V | 1.393 V |
| 55 | 1.448 V | 1.391 V |
| 65 | 1.466 V | 1.389 V |
| 75 | 1.483 V | 1.387 V |
| 90 | 1.508 V | 1.384 V |
| | 1800 ppm/°C | −200 ppm/°C |

Fig. 10

REFERENCE VOLTAGE GENERATION CIRCUIT HAVING COMPENSATION FUNCTION FOR VARIATIONS OF TEMPERATURE AND SUPPLY VOLTAGE

BACKGROUND OF THE INVENTION

1. Field of the Invention

The present invention relates in general to reference voltage generation circuits for semiconductor memory devices, and more particularly to a reference voltage generation circuit for a semiconductor memory device which is capable of generating a reference voltage which is always constant in level regardless of a variation in a supply voltage or a temperature.

2. Description of the Prior Art

Generally, an input signal at an input stage of a semiconductor memory device must be detected for read/write operations of information in the semiconductor memory device. To this end, the input signal is compared with a reference voltage. If a voltage level of the input signal is higher than that of the reference voltage, the information is recognized as 1 or high in logic. On the contrary, when the voltage level of the input signal is lower than that of the reference voltage, the information is recognized as 0 or low in logic. A reference voltage generation circuit is used to generate such a reference voltage. The reference voltage generation circuit is usually provided with a reference voltage generator for generating an initial reference voltage and a voltage amplifier for amplifying the initial reference voltage from the reference voltage generator by a predetermined level. Such a conventional voltage amplifier will hereinafter be described with reference to FIGS. 1 and 2.

Figure 1:
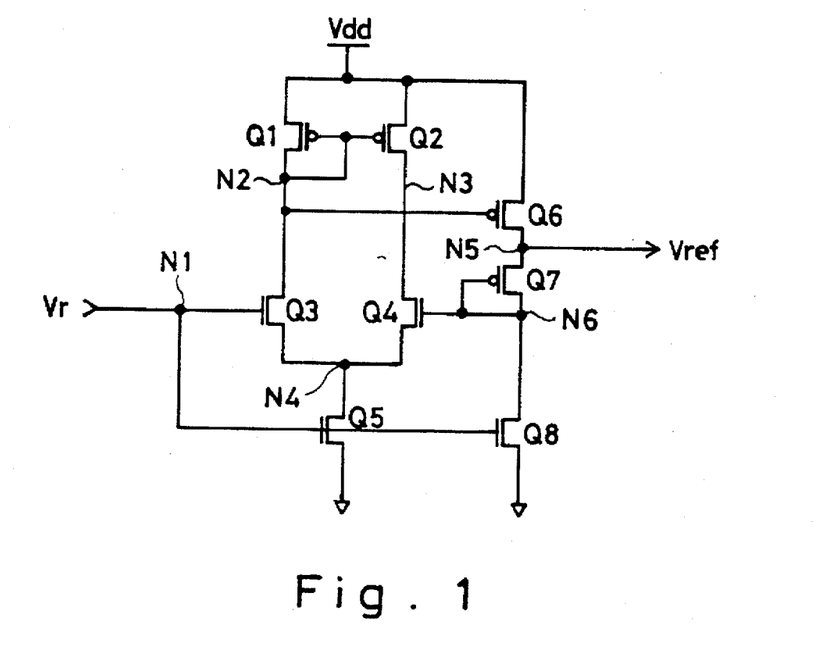
FIG. 1 is a circuit diagram of a conventional voltage amplifier.

Referring to FIG. 1, there is shown a circuit diagram of a conventional voltage amplifier. As shown in this drawing, the conventional voltage amplifier comprises a PMOS transistor Q1 connected between a supply voltage source Vdd and a node N2, a PMOS transistor Q2 connected between the supply voltage source Vdd and a node N3, an NMOS transistor Q3 connected between the node N2 and a node N4, and an NMOS transistor Q4 connected between the nodes N3 and N4. The PMOS transistors Q1 and Q2 have their gates connected in common to the node N2. Also, the PMOS transistors Q1 and Q2 act as load resistors for the NMOS transistors Q3 and Q4, respectively. The NMOS transistor Q3 has its gate connected to a node N1, which is connected to a reference voltage source Vr. In response to a reference voltage Vr from the node N1, the NMOS transistor Q3 controls an amount of current flowing from the node N2 to the node N4. The NMOS transistor Q4 has its gate connected to a node N6. In response to a voltage at the node N6, the NMOS transistor Q4 controls an amount of current flowing from the node N3 to the node N4. The current amounts flowing from the nodes N2 and N3 to the node N4 have different values according to levels of the reference voltage Vr and voltage at the nodes N1 and N6 being applied to the gates of the NMOS transistors Q3 and Q4, respectively. For example, in the case where the voltage at the node N6 is higher than the reference voltage Vr at the node N1, a voltage at the node N2 is higher than that at the node N3. On the contrary, when the voltage at the node N6 is lower than the reference voltage Vr at the node N1, the voltage at the node N2 is lower than that at the node N3. The voltages at the nodes N2 and N3 have their levels in proportion to a difference between the reference voltage Vr and voltage at the nodes N1 and N6.

The conventional voltage amplifier further comprises an NMOS transistor Q5 connected between the node N4 and a ground voltage source Vss. The NMOS transistor Q5 has its gate connected to the node N1. In response to the reference voltage Vr from the node N1, the NMOS transistor Q5 maintains the total amount of current flowing through the NMOS transistors Q3 and Q4 constant. In result, the NMOS transistor Q5 functions as a constant current source. In this manner, the PMOS transistors Q1 and Q2 and the NMOS transistors Q3–Q5 constitute a differential amplifier.

The conventional voltage amplifier further comprises a PMOS transistor Q6 connected between the supply voltage source Vdd and a node N5. The PMOS transistor Q6 has its gate connected to the node N2. In response to the voltage at the node N2, the PMOS transistor Q6 controls an amount of current flowing from the supply voltage source Vdd to the node N5.

The conventional voltage amplifier further comprises a PMOS transistor Q7 connected between the nodes N5 and N6, and an NMOS transistor Q8 connected between the node N6 and the ground voltage source Vss. The PMOS transistor Q7 acts as a resistor and the NMOS transistor Q8 functions as a variable resistor. The PMOS transistor Q7 has its gate connected to the node N6. In response to the voltage at the node N6, the PMOS transistor Q7 transfers a voltage at the node N5 to the node N6. An amount of current flowing through the PMOS transistor Q7 to the node N6 is proportioned to the level of the reference voltage Vr at the node N1. Namely, an amount of current flowing to the PMOS transistor Q7 is determined based on the reference voltage Vr at the node N1. The NMOS transistor Q8 has its gate connected to the node N1. Because the NMOS transistor Q8 is controlled by the reference voltage Vr, a resistance thereof is varied as the reference voltage Vr is varied according to a variation in a temperature or the supply voltage Vdd. The variation in the resistance of the NMOS transistor Q8 results in an instability in an amplified reference voltage Vref at the node N5.

A voltage gain indicative of an amplification degree of the voltage amplifier can be expressed by the following equation:

$$Vref = Vr\,(1 + R_P/R_N)$$

where, $R_P$ is a channel resistance of the PMOS transistor Q7 and
$R_N$ is a channel resistance of the NMOS transistor Q8.

Generally, the initial reference voltage Vr may have a little variation according to a variation in the temperature or the supply voltage Vdd. Because such a variation of the initial reference voltage Vr is directly transferred to the voltage amplifier, the reference voltage Vref amplified thereby is not stable with respect to the variation in the temperature or the supply voltage Vdd.

Figure 2:
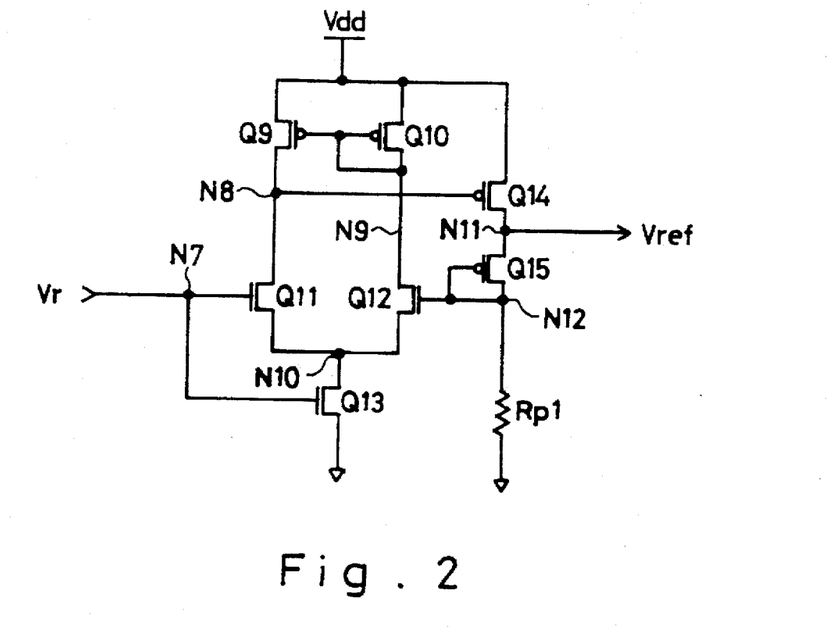
FIG. 2 is a circuit diagram of another conventional voltage amplifier, which has a temperature variation compensation function.

Referring to FIG. 2, there is shown a circuit diagram of another conventional voltage amplifier, which has a temperature variation compensation function. The construction of this drawing is substantially the same as that of FIG. 1, with the exception that a resistor Rp1 is connected between a node N12 and a ground voltage source Vss, instead of the NMOS transistor Q8 in FIG. 1, and transistors Q9 and Q10 have their gates connected to a node N9.

In the conventional voltage amplifier of FIG. 2, the reference voltage Vr and the resistor Rp1 are used to compensate for a temperature variation. The resistor Rp1 may be a poly-silicon resistor. The reference voltage Vr has its level varied according to the temperature variation. The poly-silicon resistor Rp1 has a temperature characteristic that its resistance is increased as the temperature rises. Therefore, the amplified reference voltage Vref is maintained constant under no effect of the temperature variation. However, the poly-silicon resistor is required to have its resistance of several hundred KΩ. For this reason, the poly-silicon resistor must occupy a considerable area in the semiconductor memory device.

SUMMARY OF THE INVENTION

Therefore, the present invention has been made in view of the above problem, and it is an object of the present invention to provide a reference voltage generation circuit for a semiconductor memory device which is capable of generating a reference voltage which is always constant in level regardless of a variation in a supply voltage or a temperature.

In accordance with one aspect of the present invention, there is provided a reference voltage generation circuit for a semiconductor memory device comprising reference voltage generation means for generating first and second reference voltages, the first and second reference voltages having the opposite response characteristics with respect to a variation in a temperature or a supply voltage; start-up means for determining an initial condition of the reference voltage generation means in response to the supply voltage to stabilize the operation of the reference voltage generation means; and voltage amplification means for compensating a target reference voltage for the variation in the temperature or the supply voltage in response to the first and second reference voltages from the reference voltage generation means so that the target reference voltage can always be constant in level.

In accordance with another aspect of the present invention, there is provided a reference voltage generation circuit for a semiconductor memory device comprising first reference voltage generation means for generating a first reference voltage, the first reference voltage having a positive response characteristic with respect to a temperature or a supply voltage; first start-up means for determining an initial condition of the first reference voltage generation means in response to the supply voltage to stabilize the operation of the first reference voltage generation means; second reference voltage generation means for generating a second reference voltage, the second reference voltage having a negative response characteristic with respect to the temperature or the supply voltage; second start-up means for determining an initial condition of the second reference voltage generation means in response to the supply voltage to stabilize the operation of the second reference voltage generation means; and voltage amplification means for compensating a target reference voltage for a variation in the temperature or the supply voltage in response to the first and second reference voltages from the first and second reference voltage generation means so that the target reference voltage can always be constant in level.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 3:
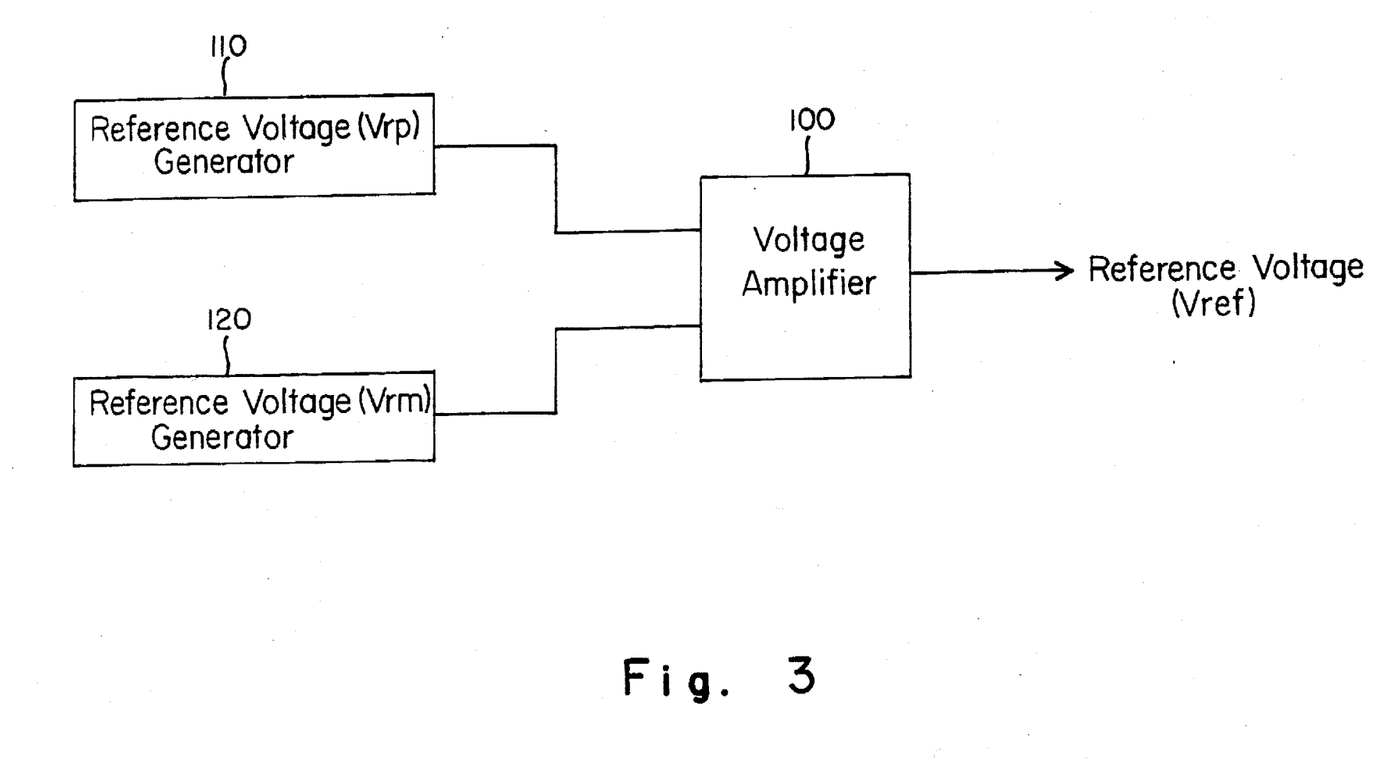
FIG. 3 is a block diagram illustrating the principle of a reference voltage generation circuit in accordance with the present invention.

Referring to FIG. 3, there is shown a block diagram illustrating the principle of a reference voltage generation circuit in accordance with the present invention. As shown in this drawing, the reference voltage generation circuit comprises a reference voltage generator 110 for generating a reference voltage Vrp, a reference voltage generator 120 for generating a reference voltage Vrm, and a voltage amplifier 100 for compensating a reference voltage Vref for a variation in a supply voltage Vdd or a temperature in response to the reference voltages Vrp and Vrm from the reference voltage generators 110 and 120 so that the reference voltage Vref can always be constant in level. The reference voltages Vrp and Vrm from the reference voltage generators 110 and 120 have the opposite response characteristics with respect to the variation in the supply voltage Vdd or the temperature.

Figure 4:
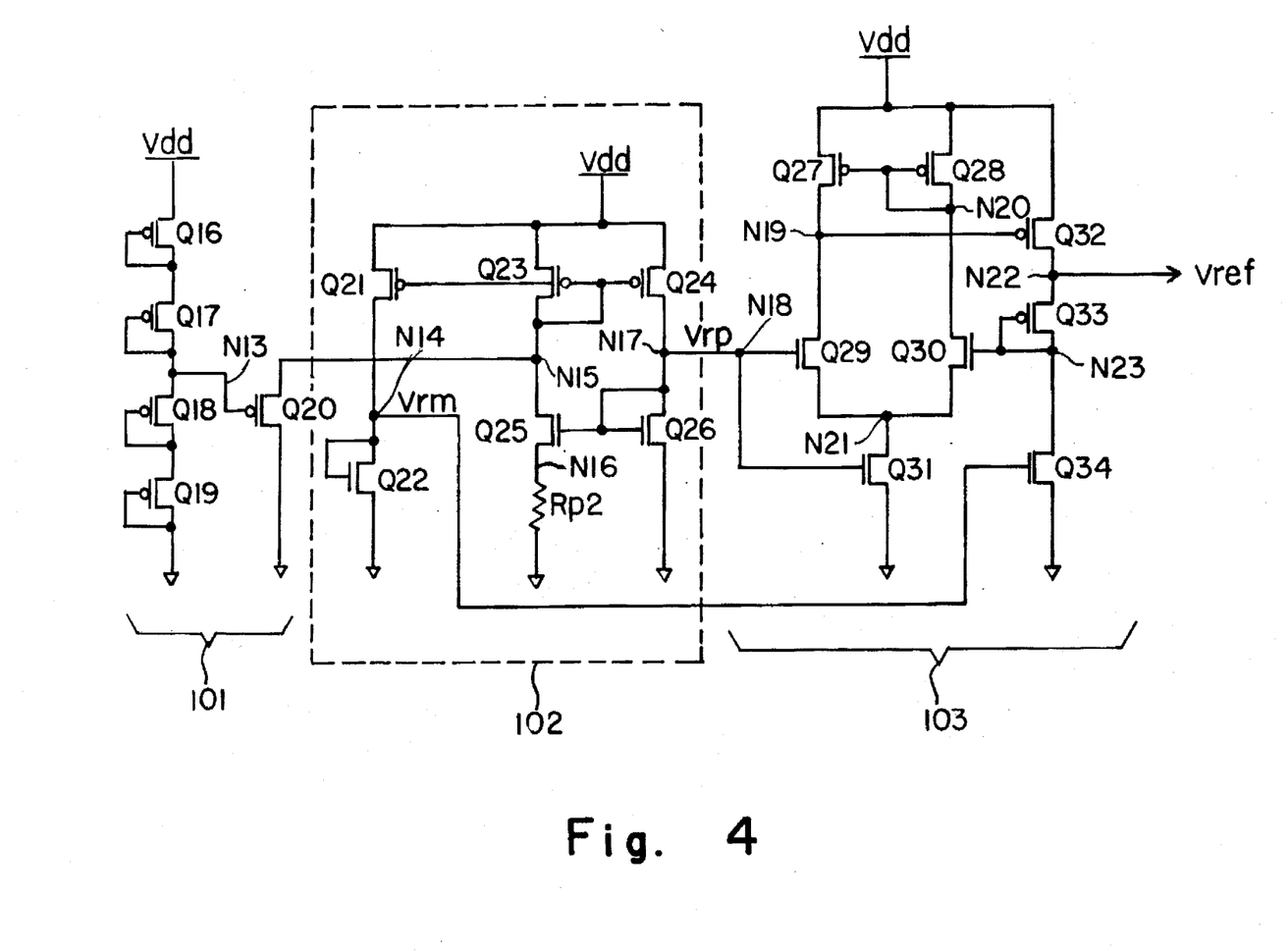
FIG. 4 is a circuit diagram of a reference voltage generation circuit in accordance with an embodiment of the present invention.

Referring to FIG. 4, there is shown a circuit diagram of a reference voltage generation circuit in accordance with an embodiment of the present invention. As shown in this drawing, the reference voltage generation circuit comprises a start-up circuit 101 for determining an initial condition of a reference voltage generator 102 upon power-up to stabilize the operation of the reference voltage generator 102. The reference voltage generator 102 is adapted to generate two reference voltages Vrp and Vrm in response to an output signal from the start-up circuit 101. The two reference voltages Vrp and Vrm from the reference voltage generator 102 have the opposite response characteristics with respect to a variation in a supply voltage Vdd or a temperature.

The reference voltage generation circuit further comprises a voltage amplifier 103 for compensating a reference voltage Vref for the variation in the supply voltage Vdd or the temperature in response to the reference voltages Vrp and Vrm from the reference voltage generator 102 so that the reference voltage Vref can always be constant in level.

The start-up circuit 101 includes PMOS transistors Q16–Q19 connected in series between a supply voltage source Vdd and a ground voltage source Vss, and a PMOS transistor Q20 connected between a node N15 and the ground voltage source Vss. The PMOS transistor Q20 has its gate connected to a node N13.

The PMOS transistors Q16–Q19 act as resistors for dividing a supply voltage Vdd which is supplied from the supply voltage source Vdd to the node N13. The PMOS transistor Q20 acts to transfer a constant current from the node N15 to the ground voltage source Vss in response to a voltage at the node N13.

The start-up circuit 101 is adapted to determine the initial condition of the reference voltage generator 102 to stabilize the operation of the reference voltage generator 102. The start-up circuit 101 has no effect on the reference voltage generator 102 while it is stably operated.

The reference voltage generator 102 is provided with a CMOS circuit. The reference voltage generator 102 is divided into two parts, one being a reference voltage (Vrp) generation part and the other being a reference voltage (Vrm) generation part. The reference voltage (Vrp) generation part includes a PMOS transistor Q23 connected between the supply voltage source Vcc and the node N15, a PMOS transistor Q24 connected between the supply voltage source Vcc and a node N17, and an NMOS transistor Q25 connected between the node N15 and a node N16. The PMOS transistors Q23 and Q24 have their gates connected in common to the node N15. The NMOS transistor Q25 has its gate connected to the node N17. The reference voltage (Vrp) generation part further includes a resistor Rp2 connected between the node N16 and the ground voltage source Vss, and an NMOS transistor Q26 connected between the node N17 and the ground voltage source Vss. The NMOS transistor Q26 has its gate connected to the node N17.

The reference voltage (Vrm) generation part includes a PMOS transistor Q21 connected between the supply voltage source Vdd and a node N14, and an NMOS transistor Q22 connected between the node N14 and the ground voltage source Vss. The PMOS transistor Q21 has its gate connected to the node N15. The NMOS transistor Q22 has its gate connected to the node N14.

The PMOS transistors Q21, Q23 and Q24 receive the supply voltage Vdd from the supply voltage source Vdd at their sources and transfer the received supply voltage to their drains. In this manner, the PMOS transistors Q21, Q23 and Q24 form a current mirror. Similarly, the NMOS transistors Q25 and Q26 form a current mirror.

The PMOS and NMOS transistors Q24 and Q26 act as resistors for dividing the supply voltage Vdd from the supply voltage source Vdd to provide a reference voltage Vrp at the node N17. The reference voltage Vrp produced by the PMOS and NMOS transistors Q24 and Q26 is supplied to the voltage amplifier 103 through the node N17 to which drains of the PMOS and NMOS transistors Q24 and Q26 are commonly connected.

The resistor Rp2 and the NMOS transistors Q25 and Q26 control an amount of current flowing through the reference voltage (Vrp) generation part according to a variation in the supply voltage Vdd or the temperature to maintain the reference voltage Vrp at the node N17 nearly constant. Preferably, the resistor Rp2 may be a poly-silicon resistor with a temperature characteristic that its resistance is increased as the temperature rises. For example, if the resistor Rp2 is increased in resistance, a voltage at the node N15 will be reduced in level. In this case, the reference voltage Vrp is increased in level because the PMOS transistor Q24 is increased in resistance.

On the other hand, the reference voltage Vrm is proportioned to a threshold voltage VT of the PMOS transistor Q21, and it is reduced in levels as the temperature rises. As a result, the two reference voltages Vrp and Vrm have the opposite response characteristics with respect to the temperature variation. In other words, the reference voltage Vrp is determined by the resistor Rp2 and the NMOS transistors Q25 and Q26, and the reference voltage Vrm is determined by the NMOS transistors Q22.

The voltage amplifier 103 includes a PMOS transistor Q27 connected between the supply voltage source Vcc and a node N19, a PMOS transistor Q28 connected between the supply voltage source Vcc and a node N20, an NMOS transistor Q29 connected between the node N19 and a node N21, and an NMOS transistor Q30 connected between the nodes N20 and N21. The PMOS transistors Q27 and Q28 have their gates connected in common to the node N20. The PMOS transistors Q27 and Q28 act as load resistors. The NMOS transistor Q29 has its gate connected to a node N18 which is connected to the node N17 or a reference voltage (Vrp) output terminal of the reference voltage generator 102. The NMOS transistor Q29 controls an amount of current flowing from the node N19 to the node N21 in response to the reference voltage Vrp at the node N18. The NMOS transistor Q30 has its gate connected to a node N23. The NMOS transistor Q30 controls an amount of current flowing from the node N20 to the node N21 in response to a voltage at the node N23. Voltages at the nodes N19 and N20 have the opposite levels according to levels of the reference voltage Vrp and voltage at the nodes N17 and N23 which are applied to the gates of the NMOS transistors Q29 and Q30, respectively. For example, when the voltage at the node N23 is higher than the reference voltage Vrp at the node N17, the voltage at the node N19 is higher than that at the node N20. On the other hand, when the voltage at the node N23 is lower than the reference voltage Vrp at the node N17, the voltage at the node N19 is lower than that at the node N20. The levels of the voltages at the nodes N19 and N20 are proportioned to a difference between the reference voltage Vrp and voltage at the nodes N17 and N23.

The voltage amplifier 103 further includes an NMOS transistor Q31 connected between the node N21 and the ground voltage source Vss. The NMOS transistor Q31 has its gate connected to the node N18. The NMOS transistor Q31 maintains the total amount of current flowing through the NMOS transistors Q29 and Q30 constant in response to the reference voltage Vrp at the node N18. In result, the NMOS transistor Q31 functions as a constant current source. In this manner, the PMOS transistors Q27 and Q28 and the NMOS transistors Q29–Q31 constitute a differential amplifier.

The voltage amplifier 103 further includes a PMOS transistor Q32 connected between the supply voltage source Vcc and an output node N22, and PMOS and NMOS transistors Q33 and Q34 connected in series between the output node N22 and the ground voltage source Vss. The PMOS transistor Q32 has its gate connected to the node N19. The PMOS transistor Q32 allows the flow of the current inversely proportioned to the level of the voltage at the node N19. As a result, the voltage at the node N23 has a variation equal to that in the reference voltage Vrp at the node N18. This reason in that the PMOS transistor Q32 has its resistance which is increased according to a level of a voltage Vref at the output node N22. The PMOS transistor Q33 connected between the output node N22 and the node N23 functions as an active resistor. The NMOS transistor Q34 connected between the node N23 and the ground voltage source Vss has its gate connected to the node N14. The NMOS transistor Q34 controls the level of the output voltage Vref at the output node N22 in response to the level of the reference voltage Vrm at the node N14. This reason is that the NMOS transistor Q34 has its resistance which is varied in inverse proportion to the level of the voltage Vref at the output node N22. Because the resistance of the NMOS transistor Q34 is controlled in such a manner, the output voltage Vref at the output node N22 is stable in level regardless of the variation in the supply voltage Vdd or the temperature. Therefore, the reference voltage generation circuit of the present invention compensates for the variation in the supply voltage Vdd or the temperature in the voltage amplifier by using the two reference voltages Vrp and Vrm with the opposite response characteristics with respect to the supply voltage or temperature variation.

The reference voltage Vref amplified by the voltage amplifier 103 can be expressed as follows:

$$Vref-Vrp\ (1+R_P/R_N)$$

$$R_P \alpha V_{ds} \alpha i_{ds} = 1/\beta_P,\ (V_{GS}-V_T) = 1/\beta_P\ (Vref-Vrp-V_T)$$

$$R_N \alpha V_{ds} \alpha i_{ds} = 1/\beta_N\ (V_{GS}-V_T) = 1/\beta_N\ (V_{rm}-V_T)$$

where, $R_P$ is a channel resistance of the PMOS transistor Q33,
$R_N$ is a channel resistance of the NMOS transistor Q34,
$\beta_N = C_{OX} \mu_N W_N/L_N$,
$\beta_P = C_{OX} \mu_P W_N/L_p$, and
$\beta_P/\beta_N = \alpha$.

Assuming $V_T = V_{TN} = |V_{TP}|$, the result is:

$$Vref = (Vrp + V_T/2) + \sqrt{(V_T/2)^2 + \alpha Vrp(Vrm - V_T)}$$

In result, the variation in the output reference voltage Vref can be minimized on the basis of the two reference voltages Vrp and Vrm with the opposite response characteristics with respect to the supply voltage or temperature variation.

Figure 5:
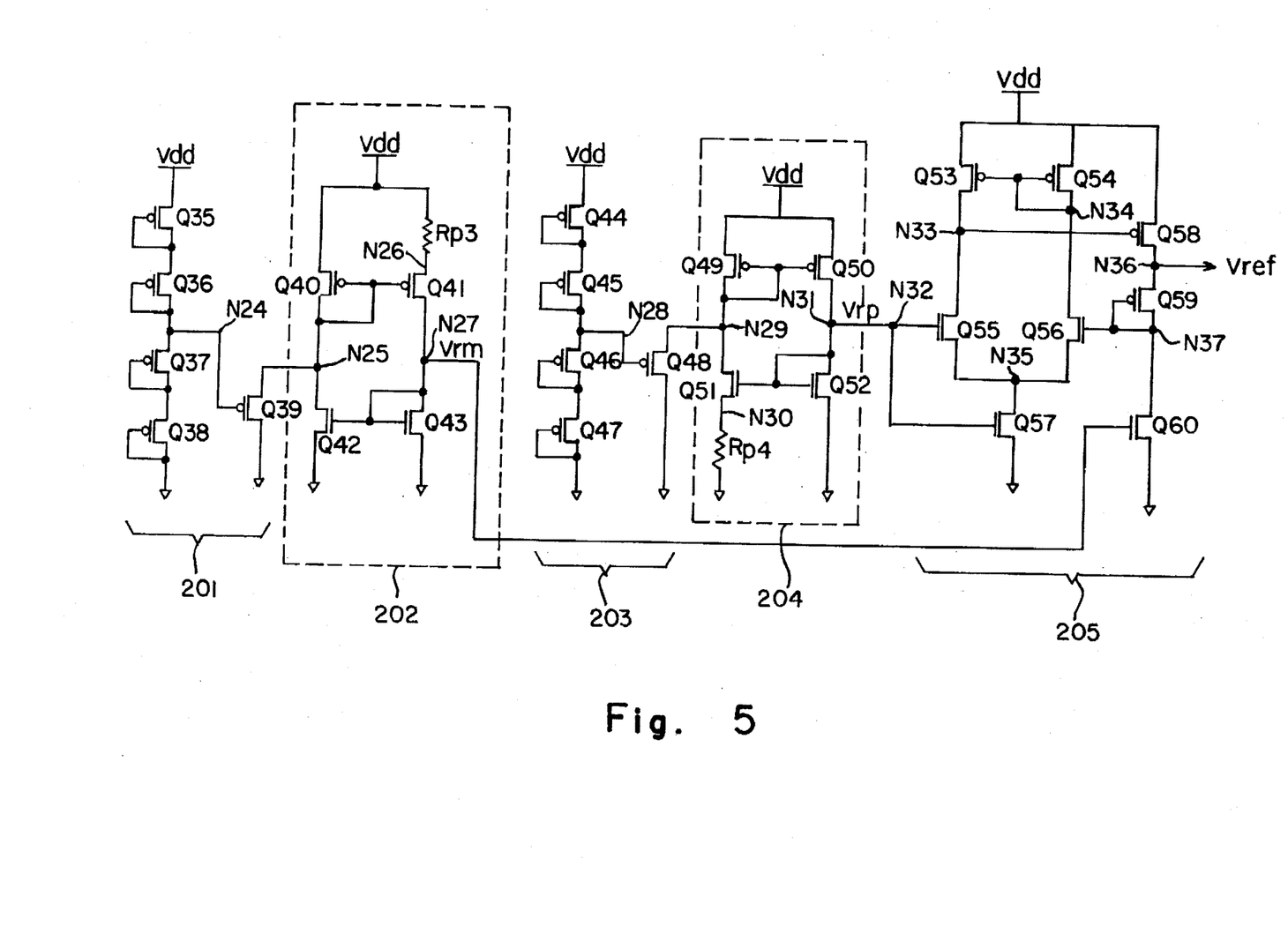
FIG. 5 is a circuit diagram of a reference voltage generation circuit in accordance with an alternative embodiment of the present invention.

Referring to FIG. 5, there is shown a circuit diagram of a reference voltage generation circuit in accordance with an alternative embodiment of the present invention. As shown in this drawing, the reference voltage generation circuit comprises a start-up circuit 201 for determining an initial condition of a reference voltage generator 202 upon power-up to stabilize the operation of the reference voltage generator 202, and a start-up circuit 203 for determining an initial condition of a reference voltage generator 204 upon power-up to stabilize the operation of the reference voltage generator 204. The reference voltage generator 202 is adapted to generate a reference voltage Vrm in response to an output signal from the start-up circuit 201. The reference voltage generator 204 is adapted to generate a reference voltage Vrp in response to an output signal from the start-up circuit 203. The reference voltages Vrp and Vrm from the reference voltage generators 204 and 202 have the opposite response characteristics with respect to a variation in a supply voltage Vdd or a temperature.

The reference voltage generation circuit further comprises a voltage amplifier 205 for compensating a reference voltage Vref for the variation in the supply voltage Vdd or the temperature in response to the reference voltages Vrp and Vrm from the reference voltage generators 204 and 202 so that the reference voltage Vref can always be constant in level.

The start-up circuit 201 includes PMOS transistors Q35–Q38 connected in series between a supply voltage source Vdd and a ground voltage source Vss, and a PMOS transistor Q39 connected between a node N25 and the ground voltage source Vss. The PMOS transistor Q39 has its gate connected to a node N24.

The PMOS transistors Q35–Q38 act as resistors for dividing a supply voltage Vdd which is supplied from the supply voltage source Vdd to the node N24. The PMOS transistor Q39 acts to transfer a constant current from the node N25 to the ground voltage source Vss in response to a voltage at the node N24.

The start-up circuit 201 is adapted to determine the initial condition of the reference voltage generator 202 to stabilize the operation of the reference voltage generator 202. The start-up circuit 201 has no effect on the reference voltage generator 202 while it is stably operated.

The reference voltage generator 202 is provided with a CMOS circuit. The reference voltage generator 202 includes a PMOS transistor Q40 connected between the supply voltage source Vdd and the node N25, a resistor Rp3 connected between the supply voltage source Vcc and a node N26, a PMOS transistor Q41 connected between the node N26 and a node N27, an NMOS transistor Q42 connected between the node N25 and the ground voltage source Vss, an NMOS transistor Q43 connected between the node N27 and the ground voltage source Vss, and an output terminal for outputting the reference voltage Vrm at the node N27. The PMOS transistors Q40 and Q41 have their gates connected in common to the node N25. The NMOS transistors Q42 and Q43 have their gates connected in common to the node N27.

The PMOS and NMOS transistors Q41 and Q43 act as resistors for dividing the supply voltage Vdd from the supply voltage source Vdd to provide the reference voltage Vrm at the node N27. The reference voltage Vrm produced by the PMOS and NMOS transistors Q41 and Q43 is supplied to the voltage amplifier 205 through the node N27 to which drains of the PMOS and NMOS transistors Q41 and Q43 are commonly connected. The resistor Rp3 and the PMOS transistors Q40 and Q41 control an amount of current flowing through the reference voltage generator 202 according to a variation in the supply voltage Vdd or the temperature to maintain the reference voltage Vrm at the node N27 nearly constant. Preferably, the resistor Rp3 may be a poly-silicon resistor with a temperature characteristic that its resistance is increased as the temperature rises. The PMOS transistors Q40 and Q41 have their threshold voltages VT which are reduced as the temperature rises. As a result, the use of the PMOS transistors Q40 and Q41 has the effect of controlling a variation of the reference voltage Vrm depending on the temperature variation.

In result, the level of the reference voltage Vrm is determined according to the resistance of the resistor Rp3 and sizes of the PMOS transistors Q40 and Q41.

The start-up circuit 203 includes PMOS transistors Q44–Q47 connected in series between the supply voltage source Vcc and the ground voltage source Vss, and a PMOS transistor Q48 connected between a node N29 and the ground voltage source Vss. The PMOS transistor Q48 has its gate connected to a node N28.

The PMOS transistors Q44–Q47 act as resistors for dividing the supply voltage Vdd which is supplied from the supply voltage source Vdd to the node N28. The PMOS transistor Q48 acts to transfer a constant current from the node N29 to the ground voltage source Vss in response to a voltage at the node N28.

The start-up circuit 203 is adapted to determine the initial condition of the reference voltage generator 204 to stabilize the operation of the reference voltage generator 204. The start-up circuit 203 has no effect on the reference voltage generator 204 while it is stably operated.

The reference voltage generator 204 is provided with a CMOS circuit. The reference voltage generator 204 includes a PMOS transistor Q49 connected between the supply voltage source Vcc and the node N29, a PMOS transistor Q50 connected between the supply voltage source Vcc and a node N31, an NMOS transistor Q51 connected between the node N29 and a node N30, a resistor Rp4 connected between the node N30 and the ground voltage source Vss, an NMOS transistor Q52 connected between the node N31 and the ground voltage source Vss, and an output terminal for outputting the reference voltage Vrp at the node N31. The PMOS transistors Q49 and Q50 have their gates connected in common to the node N29. The NMOS transistors Q51 and Q52 have their gates connected in common to the node N31.

The PMOS and NMOS transistors Q50 and Q52 act as resistors for dividing the supply voltage Vdd from the supply voltage source Vdd to provide the reference voltage Vrp at the node N31. The reference voltage Vrp produced by the PMOS and NMOS transistors Q50 and Q52 is supplied to the voltage amplifier 205 through the node N31 to which drains of the PMOS and NMOS transistors Q50 and Q52 are commonly connected. The resistor Rp4 and the NMOS transistors Q51 and Q52 control an amount of current flowing through the reference voltage generator 204 according to a variation in the supply voltage Vdd or the temperature to maintain the reference voltage Vrp at the node N31 nearly constant. Preferably, the resistor Rp4 may be a poly-silicon resistor with a temperature characteristic that its resistance is increased as the temperature rises. The NMOS transistors Q51 and Q52 have their threshold voltages VT which are reduced as the temperature rises. As a result, the use of the NMOS transistors Q51 and Q52 has the effect of controlling a variation of the reference voltage Vrp depending on the temperature variation.

In result, the reference voltage Vrp is determined according to the resistance of the resistor Rp4 and sizes of the NMOS transistors Q51 and Q52.

Noticeably, the resistances of the resistors and the sizes of the transistors can be adjusted in such a manner that the reference voltage Vrm from the reference voltage generator 202 is reduced whereas the reference voltage Vrp from the reference voltage generator 204 is increased, as the temperature rises. Therefore, the reference voltages Vrp and Vrm from the reference voltage generators 204 and 202 have the opposite response characteristics with respect to the temperature variation.

Before describing the voltage amplifier 205, the relation between the reference voltages Vrp and Vrm depending on the variations in the temperature and supply voltage Vdd will hereinafter be mentioned with reference to FIGS. 6 and 7.

Figure 6A:
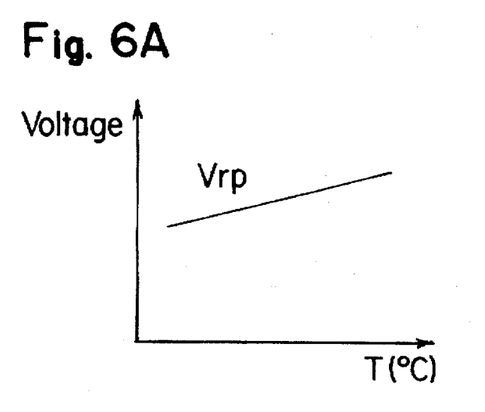
FIGS. 6A to 6C are graphs illustrating variations of reference voltages with a temperature variation in accordance with the present invention.
Figure 6B:
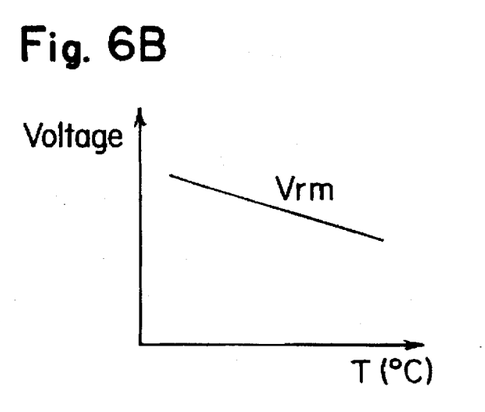
Figure 6C:
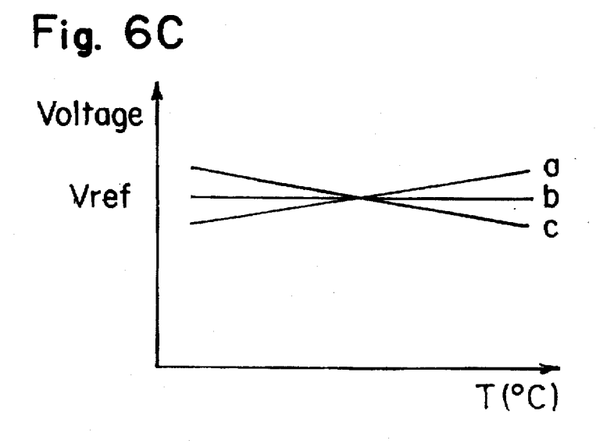

FIGS. 6A to 6C show variations of the reference voltages Vrp and Vrm with the temperature variation. FIGS. 6A and 6B are graphs illustrating the opposite response characteristics of the reference voltages Vrp and Vrm with respect to the temperature variation. As seen from FIG. 6C, the effect of the temperature variation on the reference voltage Vref can be adjusted by the varying slopes of the reference voltages Vrp and Vrm.

Figure 7A:
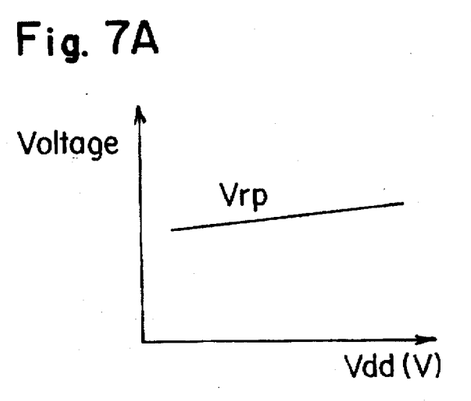
FIGS. 7A to 7C are graphs illustrating variations of reference voltages with a supply voltage variation in accordance with the present invention.
Figure 7B:
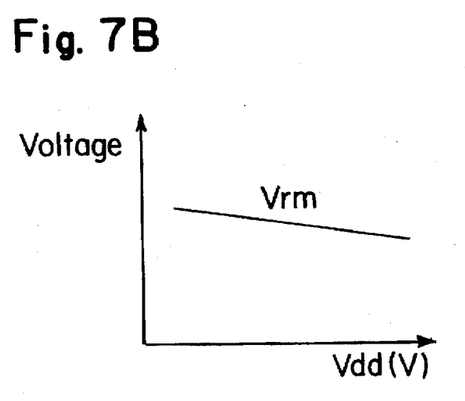
Figure 7C:
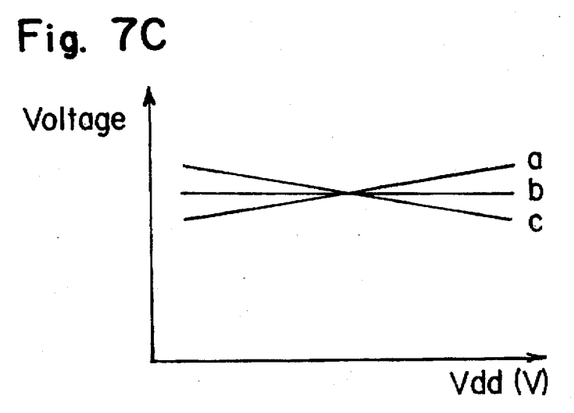

FIGS. 7A to 7C show variations of the reference voltages Vrp and Vrm with the supply voltage variation. FIGS. 7A and 7B are graphs illustrating the opposite response characteristics of the reference voltages Vrp and Vrm with respect to the supply voltage variation. As seen from FIG. 7C, the effect of the supply voltage variation on the reference voltage Vref can be adjusted by the varying slopes of the reference voltages Vrp and Vrm.

In other words, in FIGS. 4 and 5, the amplified reference voltage Vref is little influenced by the variations in the temperature and supply voltage, as shown by the graphs a, b and c in FIGS. 6C and 7C. This results from the varying slopes of the reference voltages Vrp and Vrm and the adjusted sizes of the transistors.

Referring again to FIG. 5, the voltage amplifier 205 includes a PMOS transistor Q53 connected between the supply voltage source Vcc and a node N33, a PMOS transistor Q54 connected between the supply voltage source Vcc and a node N34, an NMOS transistor Q55 connected between the node N33 and a node N35, and an NMOS transistor Q56 connected between the nodes N34 and N35. The PMOS transistors Q53 and Q54 have their gates connected in common to the node N34. The PMOS transistors Q53 and Q54 act as load resistors. The NMOS transistor Q55 has its gate connected to a node N32 which is connected to the node N31 or a reference voltage (Vrp) output terminal of the reference voltage generator 204. The NMOS transistor Q55 controls an amount of current flowing from the node N33 to the node N35 in response to the reference voltage Vrp at the node N32. The NMOS transistor Q56 has its gate connected to a node N37. The NMOS transistor Q56 controls an amount of current flowing from the node N34 to the node N35 in response to a voltage at the node N37. Voltages at the nodes N33 and N34 have the opposite levels according to levels of the reference voltage Vrp and voltage at the nodes N32 and N37 which are applied to the gates of the NMOS transistors Q55 and Q56, respectively. For example, when the voltage at the node N37 is higher than the reference voltage Vrp at the node N32, the voltage at the node N33 is higher than that at the node N34. On the contrary, when the voltage at the node N37 is lower than the reference voltage Vrp at the node N32, the voltage at the node N33 is lower than that at the node N34. The levels of the voltages at the nodes N33 and N34 are proportioned to a difference between the reference voltage Vrp and voltage at the nodes N32 and N37. As a result, the level of the voltage at the node N33 is adjusted so that the reference voltage Vrp at the node N32 and the voltage at the node N37 can be the same.

The voltage amplifier 205 further includes an NMOS transistor Q57 connected between the node N35 and the ground voltage source Vss. The NMOS transistor Q57 has its gate connected to the node N32. The NMOS transistor Q57 maintains the total amount of current flowing through the NMOS transistors Q55 and Q56 constant in response to the reference voltage Vrp at the node N32. In result, the NMOS transistor Q57 functions as a constant current source. In this manner, the PMOS transistors Q53 and Q54 and the NMOS transistors Q55–Q57 constitute a differential amplifier.

The voltage amplifier 205 further includes a PMOS transistor Q58 connected between the supply voltage source Vcc and an output node N36, and PMOS and NMOS transistors Q59 and Q60 connected in series between the output node N36 and the ground voltage source Vss. The PMOS transistor Q58 has its gate connected to the node N33. The PMOS transistor Q58 allows the current flow of amount inversely proportioned to the level of the voltage at the node N33, so that the voltage at the node N27 can have the same level as that of the reference voltage Vrp at the node N32. This reason is that the PMOS transistor Q58 has its resistance which is increased according to a level of a voltage Vref at the output node N36. The PMOS transistor Q59 connected between the output node N36 and the node N37 functions as an active resistor. The NMOS transistor Q60 connected between the node N37 and the ground voltage source Vss has its gate connected to the node N27. The NMOS transistor Q60 controls the level of the output voltage Vref at the output node N36 in response to the level of the reference voltage Vrm at the node N27. This reason is that the NMOS transistor Q60 has its resistance which is varied according to the level of the reference voltage Vrm at the node N27. Because the resistances of the PMOS and NMOS transistors Q59 and Q60 are controlled in such a manner, the output voltage Vref at the output node N36 is stable in level regardless of the variation in the supply voltage Vdd or the temperature.

FIGS. 8A to 8D show alternative embodiments of the reference voltage generator in FIGS. 4 and 5. In FIG. 8, the reference voltage generator further includes variable resistor means Q65, Q70, Q75 or Q80 with its resistance varied according to a difference between the supply voltage Vdd and the ground voltage Vss.

Figure 8A:
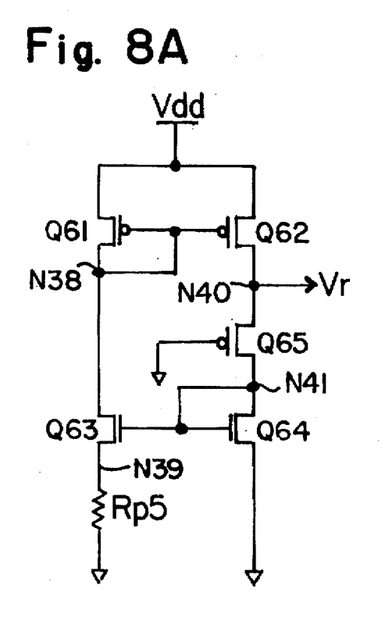
FIGS. 8A to 8D and 9A to 9B are circuit diagrams illustrating alternative embodiments of a reference voltage generator in FIGS. 4 and 5.

As shown in FIG. 8A, the reference voltage generator includes a PMOS transistor Q61 connected between the supply voltage source Vcc and a node N38, a PMOS transistor Q62 connected between the supply voltage source Vcc and a node N40, an NMOS transistor Q63 connected between the node N38 and a node N39, a resistor Rp5 connected between the node N39 and the ground voltage source Vss, a PMOS transistor Q65 connected between the node N40 and a node N41, and an NMOS transistor Q64 connected between the node N41 and the ground voltage source Vss. The PMOS transistors Q61 and Q62 have their gates connected in common to the node N38. The NMOS transistors Q63 and Q64 have their gates connected in common to the node N41. The PMOS transistor Q65 has its gate connected to the ground voltage source Vss.

Preferably, the resistor Rp5 may be a poly-silicon resistor with a temperature characteristic that its resistance is increased as the temperature rises. The resistor Rp5 is used to control a variation of a reference voltage Vr depending on the temperature variation.

For example, if the resistor Rp5 is increased in resistance, current flowing through the node N38 is reduced in amount, and current flowing through the node N40 is also reduced in amount. As a result, the PMOS transistor Q62 is increased in resistance, thereby causing the reference voltage Vr at the node N40 to be reduced in level. A desired level of reference voltage can readily be obtained by properly adjusting channel size and width of the PMOS transistor Q65.

Therefore, the level of the reference voltage Vr is determined according to the resistance of the resistor Rp5 and sizes of the NMOS transistors Q63 and Q64.

Figure 8B:
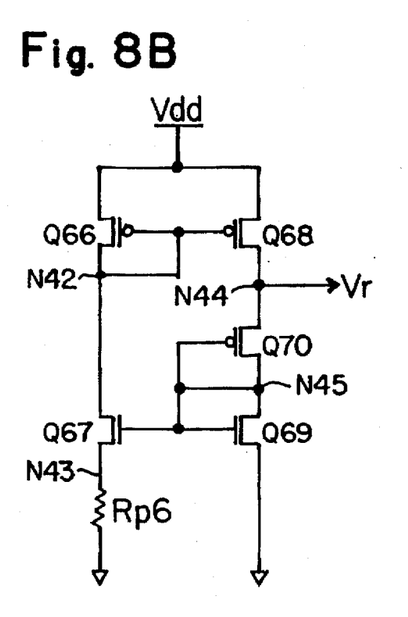

In FIG. 8B, the reference voltage generator includes a PMOS transistor Q66 connected between the supply voltage source Vcc and a node N42, a PMOS transistor Q68 connected between the supply voltage source Vcc and a node N44, an NMOS transistor Q67 connected between the node N42 and a node N43, a resistor Rp6 connected between the node N43 and the ground voltage source Vss, a PMOS transistor Q70 connected between the node N44 and a node N45, and an NMOS transistor Q69 connected between the node N45 and the ground voltage source Vss. The PMOS transistors Q66 and Q68 have their gates connected in common to the node N42. The NMOS transistors Q67 and Q69 have their gates connected in common to the node N45. The PMOS transistor Q70 has its gate connected to the node N45.

Preferably, the resistor Rp6 may be a poly-silicon resistor with a temperature characteristic that its resistance is increased as the temperature rises. The resistor Rp6 is used to control a variation of a reference voltage Vr depending on the temperature variation.

For example if the resistor Rp6 is increased in resistance, current flowing through the node N42 is reduced in amount, and current flowing through the node N44 is also reduced in amount. As a result, the PMOS transistor Q68 is increased in resistance, thereby causing the reference voltage Vr at the node N44 to be reduced in level. A desired level of reference voltage can readily be obtained by properly adjusting channel size and width of the PMOS transistor Q70.

Thus, the level of the reference voltage Vr is determined according to the resistance of the resistor Rp6 and sizes of the NMOS transistors Q67 and Q69.

Figure 8C:
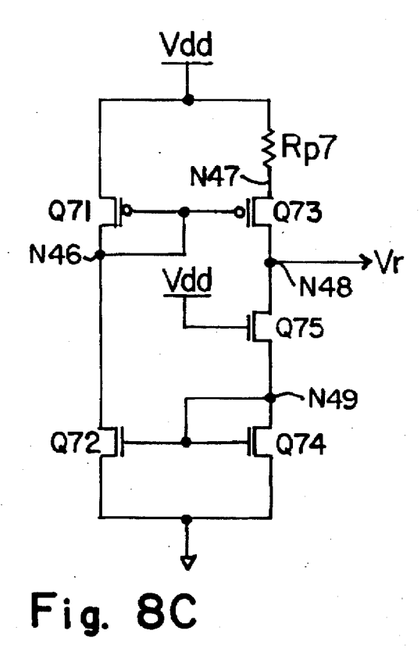

In FIG. 8C, the reference voltage generator includes a PMOS transistor Q71 connected between the supply voltage source Vcc and a node N46, a resistor Rp7 connected between the supply voltage source Vcc and a node N47, a PMOS transistor Q73 connected between the node N47 and a node N48, an NMOS transistor Q75 connected between the node N48 and a node N49, an NMOS transistor Q74 connected between the node N49 and the ground voltage source Vss, an NMOS transistor Q72 connected between the node N46 and the ground voltage source Vss, and an output terminal for outputting a reference voltage Vr at the node N48. The PMOS transistors Q71 and Q73 have their gates connected in common to the node N46. The NMOS transistors Q72 and Q74 have their gates connected in common to the node N49. The NMOS transistor Q75 has its gate connected to the supply voltage source Vcc.

The resistor Rp7 and the PMOS transistors Q71 and Q73 control an amount of current flowing through the reference voltage generator according to a variation in the supply voltage Vdd or the temperature to maintain the reference voltage Vr at the node N48 nearly constant. Preferably, the resistor Rp7 may be a poly-silicon resistor with a temperature characteristic that its resistance is increased as the temperature rises. The resistor Rp7 is used to maintain the level of the reference voltage Vr constant regardless of the temperature variation. For example, if the resistor Rp7 is increased in resistance, the PMOS transistor Q73 is increased in resistance, thereby causing current flowing to the node N48 to be reduced in amount. As a result, the reference voltage Vr at the node N48 is reduced in level.

Therefore, the level of the reference voltage Vr is determined according to the resistance of the resistor Rp7 and sizes of the PMOS transistors Q71 and Q73.

Figure 8D:
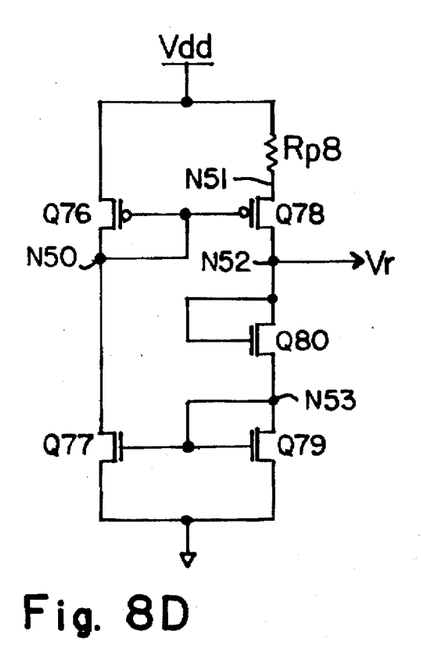

In FIG. 8D, the reference voltage generator includes a PMOS transistor Q76 connected between the supply voltage source Vcc and a node N50, a resistor Rp6 connected between the supply voltage source Vcc and a node N51, a PMOS transistor Q78 connected between the node N51 and a node N52, an NMOS transistor Q80 connected between the node N52 and a node N53, an NMOS transistor Q79 connected between the node N53 and the ground voltage source Vss, an NMOS transistor Q77 connected between the node N50 and the ground voltage source Vss, and an output terminal for outputting a reference voltage Vr at the node N52. The PMOS transistors Q76 and Q78 have their gates connected in common to the node N50. The NMOS transistors Q77 and Q79 have their gates connected in common to the node N53. The NMOS transistor Q80 has its gate connected to the node N52.

The resistor Rp3 and the PMOS transistors Q76 and Q78 control an amount of current flowing through the reference voltage generator according to a variation in the supply voltage Vdd or the temperature to maintain the reference voltage Vr at the node N52 nearly constant. Preferably, the resistor Rp3 may be a poly-silicon resistor with a temperature characteristic that its resistance is increased as the temperature rises. The resistor Rp8 is used to maintain the level of the reference voltage Vr constant regardless of the temperature variation. For example, if the resistor Rp8 is increased in resistance, the PMOS transistor Q78 is increased in resistance, thereby causing current flowing to the node N52 to be reduced in amount. As a result, the reference voltage Vr at the node N52 is reduced in level.

Hence, the level of the reference voltage Vr is determined according to the resistance of the resistor Rp8 and sizes of the PMOS transistors Q76 and Q78.

In result, in FIGS. 8A to 8D, the PMOS transistors Q65 and Q70 and the NMOS transistors Q75 and Q80 act as active resistors for raising the level of the reference voltage Vr. A desired level of reference voltage can readily be obtained by properly adjusting β or channel size and width of each MOS transistor.

Figure 9A:
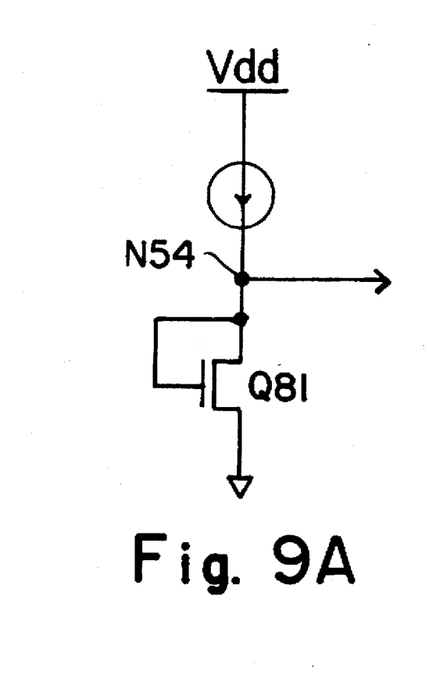
Figure 9B:
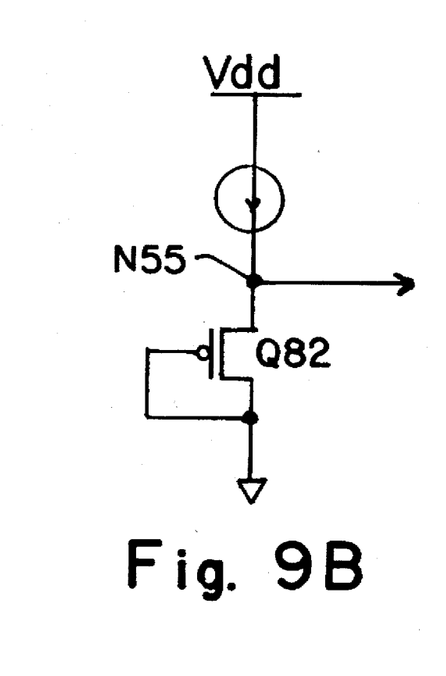

FIGS. 9A to 9B show still other embodiments of the reference voltage generator in FIGS. 4 and 5. In FIGS. 9A to 9B, the reference voltage generator includes an NMOS or PMOS transistor connected in a diode form to produce a reference voltage Vr.

In FIG. 9A, the reference voltage generator includes a constant current source connected between the supply voltage source Vcc and a node N54, an NMOS transistor Q81 connected between the node N54 and the ground voltage source Vss, and an output terminal for outputting the reference voltage Vr at the node N54. The NMOS transistor Q81 has its gate connected to the node N54.

The constant current source, indicated by an arrow, is adapted to supply a constant current to the node N54 regardless of the supply voltage Vdd. The reference voltage Vr at the node N54 is proportioned to a threshold voltage VT of the NMOS transistor Q81. In this connection, the reference voltage Vr is reduced in level as the temperature rises.

In FIG. 9B, the reference voltage generator includes a constant current source connected between the supply voltage source Vcc and a node N55, a PMOS transistor Q82 connected between the node N55 and the ground voltage source Vss, and an output terminal for outputting the reference voltage Vr at the node N55. The PMOS transistor Q82 has its gate connected to the ground voltage source Vss.

The constant current source, indicated by an arrow, is adapted to supply a constant current to the node N55 regardless of the supply voltage Vdd. In a similar manner to FIG. 9A, the reference voltage Vr is gradually reduced in level as the temperature rises.

Figure 10:
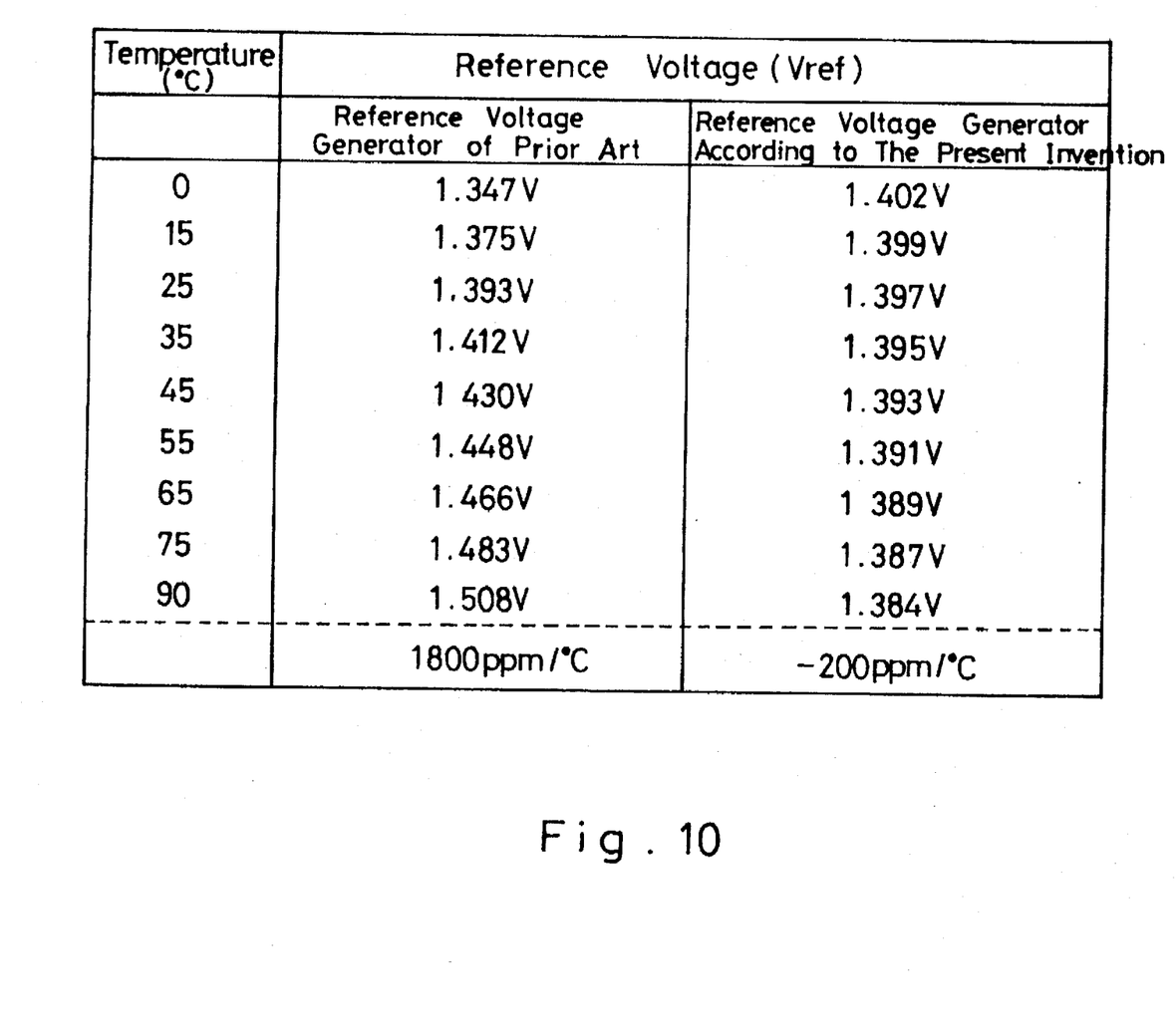
FIG. 10 is a table illustrating simulated data of the reference voltage generation circuit in accordance with the present invention.

FIG. 10 shows simulated data of the reference voltage generation circuit in accordance with the present invention. In the simulation of FIG. 10, the present and conventional reference voltage generation circuits were required to generate a reference voltage of 1.4V. Also, model parameters of 256 Mb DRAM were used and a supply voltage Vcc was 3.3V. Poly-silicon resistors used had the following temperature coefficients:

TC1=0.00118
TC2=0.00000492

As apparent from the above description, according to the present invention, the reference voltage generation circuit compensates for the variation in the supply voltage or the temperature by using the two reference voltages with the opposite response characteristics with respect to the supply voltage or temperature variation. Therefore, the target reference voltage can always be maintained constant in level regardless of the external variation.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A reference voltage generation circuit for a semiconductor memory device comprising:

reference voltage generation means for generating first and second reference voltages, said first and second reference voltages having the opposite response characteristics with respect to a variation in a temperature or a supply voltage, said reference voltage generation means including a resistor, a first current mirror, said first current mirror including a plurality of PMOS transistors, a second current mirror, said second current mirror including a plurality of NMOS transistors, a reference voltage output terminal positioned between said first and second current mirrors, and a MOS transistor connected to said reference voltage output terminal;

start-up means for determining an initial condition of said reference voltage generation means in response to the supply voltage to stabilize the operation of said reference voltage generation means; and voltage amplification means for compensating a target reference voltage for the variation in the temperature of the supply voltage in response to said first and second reference voltages form said reference voltage generation means so that said target reference voltage can always be constant in level.

2. A reference voltage generation circuit for a semiconductor memory device as set forth in claim 1, wherein said MOS transistor connected to said reference voltage output terminal outputs said first and second reference voltages at its drain and source, respectively.

3. A reference voltage generation circuit for a semiconductor memory device as set forth in claim 1, wherein said first reference voltage has a positive response characteristic with respect to the temperature and the supply voltage and said second reference voltage has a negative response characteristic with respect to the temperature and the supply voltage.

4. A reference voltage generation circuit for a semiconductor memory device comprising:

first reference voltage generation means for generating a first reference voltage, said first reference voltage having a positive response characteristic with respect to a temperature or a supply voltage;

first start-up means for determining an initial condition of said first reference voltage generation means in response to the supply voltage to stabilize the operation of said first reference voltage generation means;

second reference voltage generation means for generating a second reference voltage, said second reference voltage having a negative response characteristic with respect to the temperature or the supply voltage;

second start-up means for determining an initial condition of said second reference voltage generation means in response to the supply voltage to stabilize the operation of said second reference voltage generation means; and voltage amplification means for compensating a target reference voltage for a variation in the temperature or the supply voltage in response to said first and second reference voltages from said first and second reference voltage generation means so that said target reference voltage can always be constant in level.

5. A reference voltage generation circuit for a semiconductor memory device comprising:

reference voltage generation means for generating first and second reference voltages, said first and second reference voltages having the opposite response characteristics with respect to a variation in a temperature or a supply voltage, said reference voltage generation means including a reference voltage output terminal, a constant current source connected between a supply voltage source and said reference voltage output terminal, and a MOS transistor connected between said reference voltage output terminal and the ground voltage source;

start-up means for determining an initial condition of said reference voltage generation means in response to the supply voltage to stabilize the operation of said reference voltage generation means; and voltage amplification means for compensating a target reference voltage for the variation in the temperature or the supply voltage in response to said first and second reference voltages from said reference voltage generation means so that said target reference voltage can always be constant in level.

6. A reference voltage generation circuit for a semiconductor memory device as set forth in claim 5, wherein said MOS transistor is an NMOS transistor, said NMOS transistor having a gate connected to said reference voltage output terminal.

7. A reference voltage generation circuit for a semiconductor memory device as set forth in claim 5, wherein said MOS transistor is a PMOS transistor, said PMOS transistor having a gate connected to said ground voltage source.

* * * * *